(12) United States Patent
Kumakura

(10) Patent No.: US 7,025,852 B2
(45) Date of Patent: Apr. 11, 2006

(54) CONNECTING MATERIAL AND MOUNTING METHOD WHICH USES SAME

(75) Inventor: Hiroyuki Kumakura, Kanuma (JP)

(73) Assignees: Sony Corporation, Tokyo (JP); Sony Chemicals Corporation, Tokyo (JP)

(*) Notice: Subject to any disclaimer, the term of this patent is extended or adjusted under 35 U.S.C. 154(b) by 286 days.

(21) Appl. No.: 10/439,180

(22) Filed: May 16, 2003

(65) Prior Publication Data

US 2003/0207491 A1 Nov. 6, 2003

Related U.S. Application Data

(63) Continuation of application No. 09/776,881, filed on Feb. 6, 2001, now abandoned.

(51) Int. Cl.
*B32B 31/00* (2006.01)
(52) U.S. Cl. .............. 156/307.3; 525/121; 525/476
(58) Field of Classification Search ......... 156/307.3; 525/121, 476
See application file for complete search history.

(56) References Cited

U.S. PATENT DOCUMENTS 5,008,135 A * 4/1991 Giordano et al. ........... 427/386
5,654,081 A * 8/1997 Todd ........................ 428/209
5,667,884 A * 9/1997 Bolger ...................... 428/323

FOREIGN PATENT DOCUMENTS

| JP | 60-8375 A * | 1/1985 |
| JP | 08-335604 | 12/1996 |
| JP | 09-053001 | 2/1997 |
| JP | 11-217486 | 8/1999 |
| JP | 11-354564 | 12/1999 |
| JP | A-2001-230265 | 8/2001 |
| JP | B2-3478225 | 10/2003 |

OTHER PUBLICATIONS

BYK-Chemie GmbH, BYK-331, two pages, Feb. 1999.*
3M Novec ™ Fluorosurfactant FC-4430 Product Information, 4 pages, Oct. 2003.*
BYK-Chemie GmbH, BYK-331, two pages, Feb. 1999.
Fluorinated Surfactant Surflon, Seimi Chemicsl Company Co., 2001.

* cited by examiner

*Primary Examiner*—Jeff H. Aftergut
(74) *Attorney, Agent, or Firm*—Oliff & Berridge, PLC

(57) ABSTRACT

A connecting material containing a thermosetting resin has a surface tension of 25 to 40 mN/m (at 25° C.). The connecting material contains a surfactant to adjust the surface tension to 25 to 40 mN/m (at 25° C.). The surfactant is a silicone resin-based surfactant or a fluorine resin-based surfactant. The ratio of surfactant content is 0.01 to 5.0 wt pts per 100 wt pts resin content in the connecting material.

8 Claims, No Drawings

CONNECTING MATERIAL AND MOUNTING METHOD WHICH USES SAME

This application is a continuation of Ser. No. 09/776,881, filed Feb. 6, 2001, now abandoned.

BACKGROUND OF THE INVENTION

1. Field of the Invention

The present invention relates to a connecting material in the form of a liquid or paste which contains a thermosetting resin.

2. Description of the Related Art

A widely used method for mounting bare IC chips on wiring circuit boards is a flip-chip method which uses a connecting material that contains a thermosetting resin and a latent curing agent. Connecting materials such as anisotropic conductive adhesive pastes (ACP) and non-conducting adhesive pastes (NCP) in liquid- or paste-form have been used at normal temperatures in such mounting methods, with said materials being able to reduce tact time in the mounting step and to be applied on wiring circuit boards with a known dispenser for materials which are in the form of a paste or liquid, which requires a relatively low cost for introduction of facilities.

However, when using connecting materials in the form of a liquid or paste to mount bare IC chips on wiring circuit boards, gasification of the volatile component of the connecting material, air being trapped during the coating process, gasification of any moisture contained in the board and other such reasons cause voids to form in the connecting material layer which has been sandwiched between the wiring circuit board and the bare IC chip, and removing these voids from the system causes the melt viscosity of the connecting material to become too low during the heat and pressure application processes. Accordingly, if the voids are not removed from the connecting material layer after the hot curing process, then the resistance values following the reflow and aging processes will rise to a level unsuitable in practical application, and in certain cases the bare IC chip will float or peel off, leading to poor continuity.

Methods have been developed to try to rid the connecting material layer of voids, e.g., carrying out the heat and pressure application processes in two stages, or controlling the profile of the conditions for heat/pressure application, such as slowing down the rate of heating, but their efficacy has been less than satisfactory.

SUMMARY OF THE INVENTION

With the foregoing problems in the prior art in view, it is an object of the present invention to provide a connecting material in the form of a liquid or paste which is ideally suited for use in mounting bare IC chips or other electronic elements on wiring circuit boards, and in which any increase in the post-aging continuity resistance values is avoided, since no voids remain after connecting.

The inventors perfected the present invention by discovering that the properties of thermosetting resin-containing connecting materials in the form of a liquid or paste (void inhibition, aging resistance, etc.) are intimately tied to the surface tension of the materials, and as a result of diligent and earnest research based on this discovery they found that by adjusting the surface tension of connecting materials in the form of a liquid or paste, which is approximately 45 mN/m (25° C.), to a specific range therebelow, the afore-described objective can be achieved.

In other words, the present invention provides a connecting material which contains a thermosetting resin, said connecting material being characterised in that its surface tension (25° C.) is 25 to 40 mN/m.

The present invention also provides a mounting method, wherein the aforementioned material is supplied onto a wiring circuit board on which a bare IC chip is to be mounted, the bare IC chip is positioned thereon, and heat and pressure are applied to connect the bare IC chip to the wiring circuit board.

DESCRIPTION OF THE PREFERRED EMBODIMENTS

The present invention is described in detail below. The connecting material pertaining to the present invention can assume the form of a liquid or a paste at normal temperatures and contains a thermosetting resin, said connecting material being particularly characterised in that its surface tension (25° C.) has been adjusted to a range of 25 to 40 mN/m. It is not preferable for the surface tension to exceed 40 mN/m, as voids will not be completely removed from the connecting material after the hot curing process, leading to a marked increase in the post-aging resistance values. Conversely, it is not preferable for the surface tension to drop below 25 mN/m, as the proportion of the thermosetting resin content will decrease too far, as result of which the expected adhesive strength will not be maintained.

The surface tension can be measured using a commercial surface tensiometer (e.g., CBVP-A3 automatic surface tensiometer; Kyowa Kaimen Kagaku-sha).

One preferable method for adjusting the surface tension (25° C.) of the connecting material pertaining to the present invention to 25 to 40 mN/m involves compounding a surfactant with the connecting material in the form of a paste. Another possible method involves controlling the chemical structure, molecular weight, functional group type and concentration etc. in the thermosetting resin component.

Preferable examples of such surfactants include silicone resin- and fluorine resin-based surfactants. Preferable examples of silicone resin-based surfactants include polyether-modified polydimethylsiloxane (e.g., BYK-302; Big Chemy Japan) and aralkyl-modified polymethylalkylsiloxane (e.g, BYK-322; Big Chemy Japan), and preferable examples of fluorine resin-based surfactants include perfluoroalkylethylene oxide surfactants (e.g., DS-401 (Daikin Kogyo) and perfluoroalkyl-containing oligomers (e.g., S-393; Asahi Glass).

The amount of surfactant contained in the connecting material pertaining to the present invention will vary depending on e.g., the type of surfactant to be used; however, if the amount is too small, then the desired effect will not be obtained, while if the amount is too great, then the surfactant will bleed and the connection reliability will tend to decrease. Accordingly, it is preferable when using a silicone resin-based surfactant or a fluorine resin-based surfactant to adjust the amount of same preferably to 0.01 to 5.0 wt pts, and even more preferably to 0.01 to 2.0 wt pts per 100 wt pts resin component in the connecting material.

A latent curing agent may be preferably added to the connecting material pertaining to the present invention, in addition to the thermosetting resin.

Preferable examples of thermosetting resins include typical epoxy resins such as bisphenol A epoxy resin, bisphenol F epoxy resin and tetrabromobisphenol A epoxy resin. Examples of latent curing agents include amine microcapsules, BF₃.amine complexes, amine-imide compounds, dicyandiamide, and dicarboxylic acid dihydrazide imidazole systems.

The connecting material can be suitably further compounded with commonly used curing promoters, flame retardants, fillers, and solvents according to need. In particular, adding known electrically conductive particles for use in anisotropic conductive connecting applications enables the connecting material pertaining to the present invention to be used as an anisotropic conductive connecting material.

The viscosity of the connecting material pertaining to the present invention may preferably be adjusted as well as the surface tension, with the former preferably adjusted to 10000 to 500000 mPa·s. This is due to the fact that if the viscosity decreases too far, it will become difficult to apply the material in a specific location, while if the viscosity is too high, than the material will become difficult to dispense.

The connecting material pertaining to the present invention is preferably manufactured by uniformly mixing together a thermosetting resin and latent curing agent, and a component to be additionally compounded according to need, such as a surfactant, using a known method.

The connecting material pertaining to the present invention can be preferably used as a connecting material for use when mounting capacitors, IC chips and other electronic components on wiring circuit boards. It is used particularly preferably when mounting bare IC chips on wiring circuit boards. Specifically, the connecting material pertaining to the present invention is supplied to a wiring circuit board on which a bare IC chip is to be mounted, the bare IC chip is positioned thereon, and then by applying heat and pressure, the bare IC chip can be connected to the wiring circuit board. The connecting material layer between the bare IC chip and wiring circuit board connected in this manner will contain no voids, and consequently not only will good continuity result immediately following the connecting process, but the post-aging connecting resistance will not increase, thereby allowing a continuously stable state of connection to be realized.

EXAMPLES

The present invention shall be described in more detail below according to working examples.

Working Examples 1 to 11 and Comparative Examples 1 to 3

The surfactants shown in Table 1 were added to 100 g of a resin mixture constituted of 30 wt pts naphthalenic epoxy resin (HP-4032D, Dainippon Ink), 20 wt pts glycidyl amine (EP630; Yuka Shell Epoxy) and 50 wt pts latent curing agent (HX3741; Asahi Ciba) and uniformly mixed-together to form non-conductive connecting materials in the form of a paste.

The surface tension of each of these connecting materials was measured using an automatic surface tension gauge (CBVP-A3; Kyowa Kaimen Kagaku). The results are given in Table 1. The viscosities of the connecting materials were measured using a rotational viscometer. The results are given in Table 1.

Evaluation

The connecting materials thus obtained were applied onto circuit boards (FR5 single-layer Ni—Au plated boards; terminal pitch: 150 μm) which had been fixed on a stage kept to a temperature of 80° C. (coat thickness: 40 μm), and thereon were aligned bare IC chips (6×6 mm square; terminal pitch: 150 μm; Au-stat bumps (diameter: 60 μm; 160 bumps) using the flip-chip method. Connections were effected between the two articles by applying heat and pressure for 10 sec at 200° C. and 0.5 N/bump, and tests were carried out thereupon in the following categories. The results are given in Table 1.

(1) Void Presence

A scanning acoustic microscope (SAT) was used to detect whether any voids had formed in the thermosetting resin in the circuit boards on which the IC chips had been mounted. Those in which voids had formed are ranked as "C", and those in which none were observed are ranked as "A". The results are given in Table 1.

(2) Initial Continuity Resistance

The chain resistance of the IC chips which had been mounted on the circuit boards was measured, with those in which continuity was normal being ranked as "A", and those which exhibited poor continuity ranked as "C". The results are given in Table 1.

(3) Post-aging Continuity Resistance

An aging treatment was carried out with a pressure cooker test (PCT) (110° C.; 85% RH; 200 hrs), and the post-aging chain resistance was accordingly assessed. Those assemblies in which continuity showed virtually no change from the initial resistance were judged as normal, and ranked as "A". Assemblies in which the resistance values increased, but continuity would not be described as poor were ranked as a "B". Assemblies in which continuity was poor were ranked as "C". The results are given in Table 1.

TABLE 1

| Example No. | Surfactant type | (g) | Surface tension (mN/m) | Void presence | Continuity resistance initial/post-aging | Viscosity (25° C.) (mPa · s) |
|---|---|---|---|---|---|---|
| 1 | NYK-302*¹ | 0.01 | 39.6 | A | A A | 35,400 |
| 2 | BYK-302 | 0.1 | 36.7 | A | A A | 35,600 |
| 3 | BYK-302 | 0.5 | 33.2 | A | A A | 34,900 |
| 4 | BYK-302 | 1.0 | 31.5 | A | A A | 34,500 |
| 5 | BYK-302 | 2.0 | 30.8 | A | A A | 34,100 |
| 6 | BYK-302 | 3.0 | 30.5 | A | A B | 33,800 |

TABLE 1-continued

| Example No. | Surfactant type | (g) | Surface tension (mN/m) | Void presence | Continuity resistance initial/post-aging | Viscosity (25° C.) (mPa·s) |
|---|---|---|---|---|---|---|
| 7 | BYK-302 | 4.0 | 30.4 | A | A B | 33,200 |
| 8 | BYK-302 | 5.0 | 30.1 | A | A B | 32,400 |
| 9 | BYK-322*[2] | 0.5 | 34.5 | A | A A | 35,200 |
| 10 | DS-401*[3] | 0.5 | 28.2 | A | A A | 34,800 |
| 11 | S-393*[4] | 0.5 | 27.6 | A | A A | 35,100 |
| Comp. Ex. | | | | | | |
| 1 | (Not added) | | 44.5 | C | A A | 35,500 |
| 2 | BYK-302 | 0.005 | 42.0 | C | A B | 35,400 |
| 3 | BYK-356*[5] | 0.5 | 44.0 | C | A B | 34,800 |

Note:
*[1]polyether-modified polydimethylsiloxane (Bic Chemi Japan)
*[2]aralkyl-modified polymethylalkylsiloxane (Bic Chemi Japan)
*[3]perfluoroalkylethylene oxide additive (Daikin Kogyo)
*[4]perfluoroalkyl-containing oligomer (Asahi Glass)
*[5]acrylic surfactant (Bic Chemi Japan)

The results in Table 1 show that no voids were observed in the connecting materials in the form of a paste in which the surface tension (25° C.) had been adjusted to 25 to 40 mN/m by compounding a silicone resin-based surfactant or a fluorine resin-based surfactant, following the connecting process, and accordingly, the post-aging connection reliability was deemed to be good. In consideration of the amount of surfactant (resin component) added in Working Example 1 (0.01 g) and Comparative Example 2 (0.005 g; surface tension: at least 40 mN/m; voids observed), it was evident that adding at least 0.01 g per 100 g resin mixture is preferable. In comparison to when 2.0 g was added (Working Example 5) or when 3.0 to 5.0 g were added (Working Examples 6 to 8), the latter cases exhibited a tendency for the post-aging continuity resistance values to rise.

The connecting material pertaining to the present invention can be used to connect bare IC chips or other electronic elements to wiring circuit boards without any voids being formed. Accordingly, not only will the continuity directly after the connection process be good, but the post-aging connection resistance will not increase, and a stable state of connection can be maintained.

The entire disclosure of the specification and claims of Japanese Patent Application No. 2000-41436 filed on Feb. 15, 2000 is hereby incorporated by reference.

What is claimed is:

1. A mounting method, comprising:
applying a connecting material comprising a thermosetting resin, a latent curing agent, and a surfactant onto a wiring circuit board on which a bare IC chip is to be mounted,
positioning the bare IC chip on the wiring circuit board, and
applying heat and pressure to connect the bare IC chip to the wiring circuit board;
wherein the connecting material is manufactured by a process comprising:
uniformly mixing together the thermosetting resin and the latent curing agent to form a resin composition; and
uniformly mixing 0.01 to 5.0 parts by weight of a surfactant with 100 parts by weight of the resin composition so as to allow the connecting material to have a surface tension at 25° C. of 25 to 40 mN/m and a viscosity at 25° C. of 10,000 to 500,000 mPa·s.

2. The method according to claim 1, wherein the surfactant is a silicone resin-based surfactant or a fluorine resin-based surfactant.

3. The method according to claim 1, wherein the surfactant is a silicone resin-based surfactant selected from the group consisting of polyether-modified polydimethylsiloxane and aralkyl-modified polymethylalkylsiloxane.

4. The method according to claim 1, wherein the surfactant is a fluorine resin-based surfactant selected from the group consisting of perfluoroalkylethylene oxide surfactants and perfluoroalkyl-containing oligomers.

5. The method according to claim 1, wherein the thermosetting resin is an epoxy resin.

6. The method according to claim 1, wherein the thermosetting resin is selected from the group consisting of bisphenol A epoxy resin, bisphenol F epoxy resin, and tetrabromobisphenol A epoxy resin.

7. The method according to claim 1, wherein the latent curing agent is selected from the group consisting of amine microcapsules, $BF_3$.amine complexes, amine-imide compounds, dicyandiamide, and dicarboxylic acid dihydrazide imidazole systems.

8. The method according to claim 1, wherein the connecting material is manufactured by a process comprising mixing together the resin composition and at least one additive selected from the group consisting of curing promoters, flame retardants, fillers, and solvents.

* * * * *